(12) United States Patent
Lobenstein et al.

(10) Patent No.: US 11,549,991 B2
(45) Date of Patent: Jan. 10, 2023

(54) METHOD OF MONITORING A STATE OF CHARGE OF A BATTERY

(71) Applicant: Endress+Hauser SE+Co. KG, Maulburg (DE)

(72) Inventors: Ralf Lobenstein, Schopfheim (DE); Gautham Karnik, Whitestown, IN (US)

(73) Assignee: Endress+Hauser SE+Co. KG, Maulburg (DE)

( * ) Notice: Subject to any disclaimer, the term of this patent is extended or adjusted under 35 U.S.C. 154(b) by 323 days.

(21) Appl. No.: 17/022,382

(22) Filed: Sep. 16, 2020

(65) Prior Publication Data

US 2022/0082628 A1 Mar. 17, 2022

(51) Int. Cl.
*G01R 31/3842* (2019.01)
*H02J 7/34* (2006.01)
*G01R 1/20* (2006.01)

(52) U.S. Cl.
CPC ......... *G01R 31/3842* (2019.01); *G01R 1/203* (2013.01); *H02J 7/345* (2013.01)

(58) Field of Classification Search
CPC ..... G01R 31/3842; G01R 1/203; H02J 7/345; H02J 7/0048
See application file for complete search history.

(56) References Cited

U.S. PATENT DOCUMENTS

| | | | | |
|---|---|---|---|---|
| 2007/0195568 A1* | 8/2007 | Sato | .................. | H02J 7/007182 363/123 |
| 2010/0261044 A1* | 10/2010 | Thoren | ............... | H02J 7/00036 429/92 |
| 2010/0283472 A1* | 11/2010 | Thoren | ................ | G01R 31/392 324/433 |
| 2022/0037907 A1* | 2/2022 | Mackay | .................. | H02M 1/32 |

FOREIGN PATENT DOCUMENTS

DE 112005002531 T5 * 9/2007 ............ H02J 7/0065

OTHER PUBLICATIONS

DE-112005002531-T5_Translated (Year: 2007).*
DE-112005002531-T5 (Year: 2007).*

\* cited by examiner

*Primary Examiner* — Natalie Huls
*Assistant Examiner* — Michael J Singletary
(74) *Attorney, Agent, or Firm* — Mark A. Logan; Endress+Hauser (USA) Holding Inc.

(57) ABSTRACT

A method of monitoring a state of charge of a battery of a field device wherein the field device includes the battery, a voltage converter and a battery-powered component connected to the voltage converter, is disclosed. The method includes enabling the voltage converter and subsequently operating the voltage converter in duty cycles based on a current flowing from the battery to the voltage converter by repeatedly: disabling the voltage converter when the current exceeds an upper limit and enabling the voltage converter again when the current drops below a lower limit; and at (Continued)

least once determining and providing a state of charge of the battery determined based on a duration of at least one first time interval during which the voltage converter was enabled during one of the duty cycles and a previously determined dependency of the durations on the state of charge of the battery.

16 Claims, 1 Drawing Sheet

METHOD OF MONITORING A STATE OF CHARGE OF A BATTERY

TECHNICAL FIELD

The present disclosure relates to a method of monitoring a state of charge of a battery of a field device, the field device comprising: the battery and a voltage converter having an input connected to the battery and an output connected to at least one component of the field device powered by the battery, as well as to a field device performing this method.

BACKGROUND

Field devices of various types are used in many applications. As an example, field devices are applied in process automation technology to monitor, regulate and/or control operation of industrial sites, as well as to monitor, regulate and/or control at least one process, like e.g. a production process, performed at, on or by the industrial site. Field devices applied for this purpose comprise measurement devices measuring at least one variable, like e.g. a pressure sensor, a temperature sensor or a flow flowmeter, as well as actuators, like e.g. valves, applied to influence the operation and/or the process. In many applications field device are connected to and/or embodied to communicate with a superordinate unit, like e.g. a control unit, an automation system or a programmable logical controller, visualizing, monitoring, regulating and/or controlling operation of the site and/or at least one process performed at, on or by the site.

Due to the progress achieved in reducing the power consumption of components of field devices, there is an increasing number of battery powered field devices available on the marked.

Because of the important role of field devices in process automation proper operation of field devices has to be ensured at all times. This requires for disposable batteries of field devices to be replaced and for rechargeable batteries to be recharged in due time before the end of their operating time.

The operating time of a battery depends on the capacity of the battery given by the amount of electric charge it can deliver at a voltage specified for the battery, the power consumption of the battery powered components of the field device, as well as on ambient conditions, like e.g. an ambient temperature, the battery is exposed to. Thus, the operating times of batteries of the same type can vary significantly.

A remaining operating time of a battery can be estimated based on the state of charge of the battery given by the level of charge of the battery in relation to the capacity of the battery.

Methods of determining the state of charge of a battery known in the art include a method of estimating the state of charge based on a measurement of the battery voltage.

Some batteries, like e.g. lithium-ion batteries or lithium chloride batteries exhibit a discharge curve, representing the battery voltage as a function of the state of the charge of the battery, wherein changes of the battery voltage are small during discharging over most of their capacity until the battery is nearly empty. In consequence, determining the state of charge of these batteries based on the battery voltage does not provide very accurate results during a first part of the operating time of these batteries, during which changes of the battery voltage caused by discharging are small.

This problem is overcome by a method of monitoring a state of charge of a battery of a field device, the field device comprising: the battery and a voltage converter having an input connected to the battery and an output connected to at least one component of the field device powered by the battery, described in US 2010/0283472 A1.

This monitoring method is performed by during a first time interval of the operating time of the battery determining the power consumed by the field device. Determining the power consumed is e.g. performed by coulomb counting. Coulomb counting is a method known in the art, wherein a coulomb counter is applied to estimate the state of charge of a battery based on an integral of the current drawn from the battery over time. As an alternative the power consumed during the first time interval is e.g. determined based on power consumption values associated with the operation states the field device was operated in during the first time interval.

During a second time interval of the operating time of the battery, starting when the total power consumed exceeds a predetermined threshold, the state of charge of the battery is determined by exposing the battery to a known high load at predefined time intervals and by determining the state of charge of the battery based on a voltage drop caused by connecting the load to the battery. Further, a warning report is generated, when the voltage drops caused by connecting the load exceed a predetermined threshold.

This method provides the advantage, that the state of charge, in particular the state of charge of batteries exhibiting an almost constant voltage until they are nearly empty, can be accurately determined during both the first time interval and the second time interval.

A disadvantage of this method is, that unless the battery is fully charged at the beginning an initial state of charge of the battery should be accounted for to achieve an accurate determination of the total power consumed.

When coulomb counting is applied, the coulomb counter has to be operated during the entire first time interval. Otherwise, the power consumed during the first time interval cannot be determined correctly. This makes the method very sensitive to interruptions occurring during the first time interval.

Another disadvantage is the power loss caused by repeatedly connecting the load to the battery. This power loss accelerates the discharging of the battery during the second time interval, during which the state of charge is already low, due to the total power consumed during the first time interval.

Accordingly, there remains a need for further contributions in this area of technology.

As an example, there is a need for a method of determining the state of charge of a battery, that causes lower power losses, that makes it possible for the battery to be operated for a longer time and/or that can be performed regardless of the initial state of charge of the battery.

SUMMARY

The present disclosure discloses a method of monitoring a state of charge of a battery of a field device, the field device comprising: the battery and a voltage converter having an input connected to the battery and an output connected to at least one component of the field device powered by the battery, the method comprising the steps of:

initially enabling the voltage converter and subsequently operating the voltage converter in duty cycles performed based on a current flowing from the battery to the voltage converter by repeatedly performing the steps of:

disabling the voltage converter when the current drawn by the enabled voltage converter exceeds a predetermined upper limit, and enabling the voltage converter again, when the current drops below a predetermined lower limit;

wherein each duty cycle comprises a first time interval, during which the voltage converter is enabled and a second time interval, during which the voltage converter is disabled;

at least once determining a duration of one of the first intervals; and at least once determining and providing a state of charge of the battery determined based on at least one of the durations and a previously determined dependency of the durations on the state of charge of the battery.

The method provides the advantage that the determination of the state of charge requires very little power and that the power required to perform the method does not increase towards the end of the operating time of the battery. In difference to methods determining the state of charge based on a voltage drop of the battery voltage induced by connecting a load, hardly any energy is wasted. Instead the power provided to the input of the voltage converter is converted and subsequently available at the output of the voltage converter to power the component.

Another advantage is that the intermitted operation of the voltage converter caused by operating the voltage converter in the duty cycles limits the discharge current of the battery. This is especially advantageous when the voltage converter is a step-up converter. Regardless of the type of voltage converter applied, limiting the discharge current provides the advantage that it leads to a higher energy efficiency and a longer lifetime of the battery.

Another advantage is that the method provides reliable results regardless of the initial state of charge of the battery at the beginning of the method.

In an embodiment, the providing of the state of charge of the battery comprises at least one of the steps of: at least once providing and/or indicating a battery charging level corresponding to the determined state of charge of the battery; providing and/or indicating a warning when the state of charge drops below a predetermined first charging level; and providing and/or indicating an alarm when the state of charge drops below a predetermined second charging level.

In another embodiment, an energy storage or an energy storage consisting essentially of a supercapacitor or comprising at least one supercapacitor is connected to the output of the voltage converter in parallel to the component. During at least one first time period the energy storage is charged with power provided by the battery and supplied to the energy storage by the voltage converter. During at least one second time period at least a fraction of the power required to operate the component is provided to the component by the energy storage.

In such an embodiment, the first time periods comprise at least one time period during which the power supplied by the battery via the voltage converter is sufficiently high to provide the power required by the component and to charge the energy storage. The first time periods may further comprise at least one time period at the beginning of the operating time of the battery. The second time periods comprise at least one of: at least one time period during which the power provided by the voltage converter is zero or insufficient to power the component; at least one low charge time period during which the state of charge of the battery is lower than a predetermined charging level; at least one replacement period during which the battery is replaced; at least one recharging period during which the battery is being recharged; and at least one time period during which the battery is removed from the field device.

In another embodiment, the method comprises the steps of: applying a buffering capacitor connected in parallel to the battery between the battery and the voltage converter to extend an operating time of the battery; monitoring the state of charge of the battery; and changing an operation mode of the voltage converter into an empty mode when the state of charge drops below a predetermined low charging level. An empty mode duty cycle includes a recovery time interval during which the voltage converter is disabled to enable the battery to recover and to charge the buffering capacitor up to a charging level corresponding to a battery voltage of the recovering battery. An empty cycle further includes an operating time interval during which the voltage converter is enabled and during which the current drawn by the voltage converter is provided by both the battery and the buffering capacitor.

In such an embodiment the operating time intervals are shorter than the recovery time intervals.

The present disclosure further comprises a field device performing the method disclosed. The field device comprises: the battery; the voltage converter having the input connected to the battery and the output connected to the at least one component of the field device powered by the battery; and a control system comprising a processor and a current sensor sensing the current flowing from the battery to the voltage converter. The control system is embodied to initially enable the voltage converter and to subsequently operate the voltage converter in duty cycles performed based on the current sensed by the current sensor. The duty cycles include repeatedly disabling the voltage converter when the current drawn by the enabled voltage converter exceeds the upper limit and enabling the voltage converter again when the current drops below the lower limit. The field device further comprises a timer determining the duration of the first time intervals of the duty cycles during which the voltage converter is enabled and a battery status determination unit determining and providing the state of charge of the battery determined based on at least one of the durations determined by the timer and the dependency of the durations on the state of charge of the battery stored in a memory associated to the battery status determination unit.

In an embodiment the field device further comprises an energy storage or an energy storage consisting essentially of a supercapacitor or comprising at least one supercapacitor connected to the output of the voltage converter in parallel to the component. The supercapacitor may be a hybrid layer capacitor that includes lithium intercalation compounds. Such hybrid layer capacitors have a low impedance and can deliver high current pulses. These hybrid layer capacitors have a very long shelf life.

In another embodiment the field device further comprises a smoothing capacitor connected in parallel with the battery between the battery and the voltage converter and smoothing current spikes and drops caused by operating the voltage converter in the duty cycles.

In another embodiment of the field device a buffering capacitor is connected in parallel with the battery between the battery and the voltage converter. In this embodiment the battery status determination unit is embodied or programmed to monitor the state of charge of the battery based on the state of charge determined by the battery status determination unit or based on the durations of the first time intervals determined by the timer. The battery status determination unit provides an output to the control system when the state of charge drops below a predetermined low charging level or when the durations exceed a predetermined duration limit. In such an embodiment of the field device, the control system is embodied, upon receipt of the output provided by the battery status determination unit, to operate the step of converter in empty mode duty cycles, wherein each empty mode duty cycle comprises a recovery time interval during which the voltage converter is disabled to enable the battery to recover and to charge the buffering capacitor up to a charging level corresponding to a battery voltage provided by the recovering battery and an operating time interval during which the voltage converter is enabled and during which the current drawn by the voltage converter is provided by both the battery and the buffering capacitor.

In another embodiment of the field device the current sensor comprises a sensing resistor inserted in a line connecting a terminal of the battery to the input of the voltage converter and a comparator having a first input connected to the line at a connecting point located between the terminal of the battery and the sensing resistor and a second input connected to the line at a connecting point located between the sensing resistor and the input port of the voltage converter. The comparator provides an output corresponding to the current sensed by the current sensor.

In another embodiment of the field device, an output of the current sensor is connected to an enabling port of the voltage converter, and the current sensor is embodied as a switch providing an output signal or an output voltage to the enabling port of the voltage converter. The voltage converter is disabled when the current sensed by the current sensor exceeds the upper limit and enabled again when the current sensed by the current sensor drops below the lower limit.

In an alternative embodiment of the field device, the processor is connected to an output of the current sensor and connected to an enabling port of the voltage converter. The processor reads an output provided by the current sensor and provides a control signal or a control voltage to the enabling port such that the voltage converter is disabled when the current sensed by the current sensor exceeds the upper limit and enabled again when the current sensed by the current sensor drops below the lower limit.

In another embodiment of the field device, the battery is a disposable battery or a rechargeable battery comprising a single battery element or a battery pack comprising two or more battery elements. The battery status determination unit is connected to a display indicating a battery charging level determined by the battery status determination unit, indicating a warning when the state of charge drops below a predetermined first charging level, and/or indicating an alarm when the state of charge drops below a predetermined second charging level. The field device includes an interface providing: a signal corresponding a battery charging level determined by the battery status determination unit; a warning signal when the state of charge drops below a predetermined first charging level; and/or an alarm signal when the state of charge drops below a predetermined second charging level. and/or at least one LED indicating a warning when the state of charge drops below a predetermined first charging level and/or indicating an alarm when the state of charge drops below a predetermined second charging level.

In another embodiment the field device is: a field device measuring at least one variable, a measurement devices or a sensor, an actuator, a portable device, a battery operated service tool embodied to be connected to or to communicate with another field device and/or embodied to service, to configure and/or parametrize the other field device, a battery powered user interface embodied to be connected to or to communicate with another field device, a battery powered adapter, or a communication interface or a wireless communication interface enabling another field device connected to the communication interface or to the wireless communication interface to communicate with another field device and/or with a superordinate unit, a control system or a programmable logic control unit.

BRIEF DESCRIPTION OF THE DRAWINGS

The described embodiments and other features, advantages and disclosures contained herein, and the manner of attaining them, will become apparent and the present disclosure will be better understood by reference to the following description of various embodiments of the present disclosure taken in junction with the accompanying drawings, wherein.

DETAILED DESCRIPTION

The present disclosure includes a method of monitoring a state of charge of a battery of a field device, the field device comprising: the battery and a voltage converter having an input connected to the battery and an output connected to at least one component of the field device powered by the battery, as well as a field device embodied to perform this method.

The field device can be any device that comprises a battery and at least one component powered by the battery via a voltage converter. As an option, the entire field device can be powered by the battery.

As an example, the field device is e.g. a field device applied in automation technology. To this extent, the field device is e.g. an actuator or a field device measuring at least one variable, like e.g. a measurement device or a sensor. As another example, the field device is e.g. portable device like e.g. a battery operated service tool embodied to be connected to or to communicate with another field device and/or embodied to service, to configure and/or to parametrize the other field device. As another option, the field device is e.g. a battery powered user interface embodied to be connected to or to communicate with another field device. As another option, the field device is e.g. a battery powered adapter, like e.g. a communication interface or a wireless communication interface, enabling a field device connected to the adapter to communicate with another field device and/or with a superordinate unit, like e.g. a control system or a programmable logic control unit.

The battery is e.g. given by a single battery element or embodied as a battery pack comprising two or more battery elements. To this extent, battery elements available on the market can be applied. As an example the battery can e.g. comprise at least one battery element given by a lithium-battery, like e.g. lithium-thionylchloride battery. Regardless of the number of battery elements comprised in the battery, the battery is either a rechargeable battery or a disposable battery.

Figure 1:
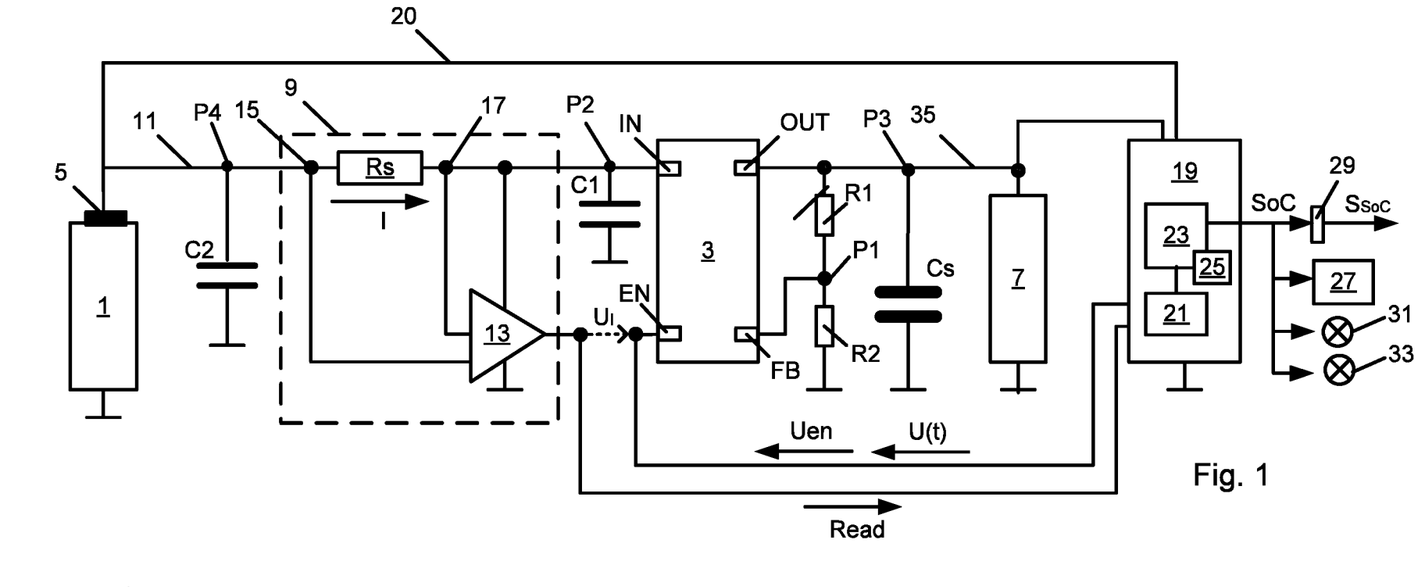
FIG. 1 shows a block diagram of a field device.

FIG. 1 shows a block diagram of a field device embodied to perform the method described herein. The field device comprises the battery 1, the voltage converter 3 having an input IN connected to a terminal 5 of the battery 1 and an output OUT connected to at least one component 7 of the field device powered by the battery 1.

During performance of the method, the voltage converter 3 converts a voltage supplied by the battery 1 into a voltage required by the component 7 and provides power to the component 7. To this extent voltage converters available on the market can be used. As an example the voltage converter 3 is e.g. a step-up converter, a step-down converter or another type of voltage converter. Regardless of type of voltage converter applied, voltage converters provides the advantage that very little power is required to operate them.

Depending on the type of voltage converter 3 applied, an internal and/or external feedback loop may be required to regulate and/or to control the voltage provided at the output OUT of the voltage converter 3. FIG. 1 shows an example of an external feedback loop comprising a voltage divider connected to the output OUT of the voltage converter 3. The voltage divider is connected in parallel to the voltage converter 3 and comprises two resistors R1, R2 connected in series. In this example a feedback port FB of the voltage converter 3 is connected to a connecting point P1 located between the two resistors R1, R2.

Monitoring of the state of charge of the battery 1 is performed by initially enabling the voltage converter 3. By enabling the voltage converter 3, the voltage converter 3 is switched on and thus draws a current I flowing from the battery 1 to the voltage converter 3. Following the initial enabling, the voltage converter 3 is operated in duty cycles performed based on the current I flowing from the battery 1 to the voltage converter 3.

To this extent, the field device comprises a current sensor 9, sensing this current I and providing an output $U_I$ corresponding to the current I sensed by the current sensor 9.

FIG. 1 shows an example wherein the current sensor 9 comprises a sensing resistor Rs inserted in a line 11 connecting the terminal 5 of the battery 1 to the input IN of the voltage converter 3 and a comparator 13, like e.g. a differential amplifier. As shown in FIG. 1, a first input of the comparator 13 is connected to the line 11 at a connecting point 15 located between the terminal 5 of the battery 1 and the sensing resistor Rs and a second input of the comparator 13 is connected to the line 11 at a connecting point 17 located between the sensing resistor Rs and the input port IN of the voltage converter 3. In this example the output $U_I$ is e.g. provided in form of an output voltage corresponding to the current I sensed by the current sensor 9. Sensing the current I based on the voltage drop across the sensing resistor Rs provides the advantage, that hardly any current is drawn from the battery 1 by the comparator 13.

As an alternative another type of current sensor, like e.g. a current measurement transformer, can be used instead.

Figure 2:
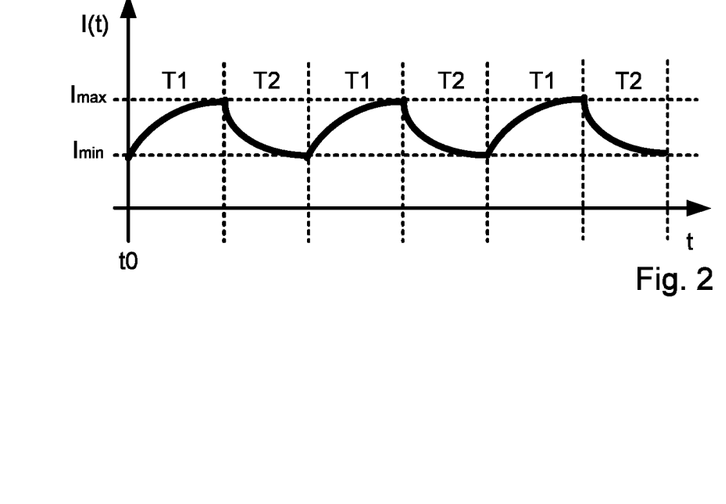
FIG. 2 shows a current sensed by the current sensor shown in FIG. 1.
Figure 3:
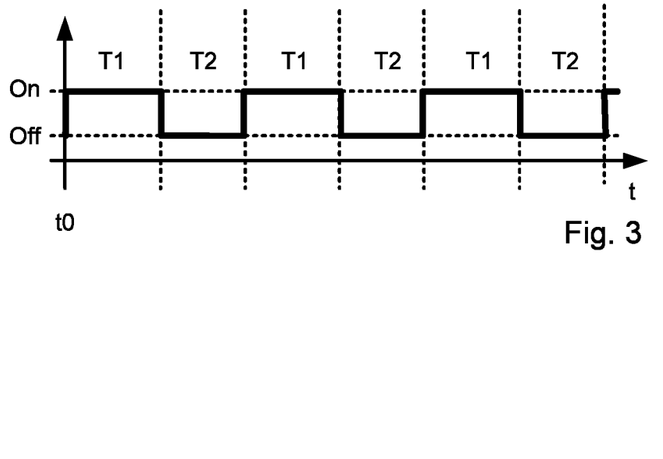
FIG. 3 shows operation states of the voltage converter shown in FIG. 1 corresponding to the current shown in FIG. 2.

Each duty cycle is performed such that the voltage converter 3, which is enabled at the beginning of the respective duty cycle, is disabled when the current I drawn by the enabled voltage converter 3 exceeds a predetermined upper limit Imax. By disabling the voltage converter 3 the voltage converter 3 is switched off. This causes the current I flowing from the battery 1 to the voltage converter 3 to decrease rapidly. Following the disabling of the voltage converter 3, the voltage converter 3 is enabled again, when the current I flowing from the battery 1 to the voltage converter 3 drops below a predetermined lower limit Imin. Re-enabling the voltage converter 3 causes the current I to increase again. When the increasing current I exceeds the upper limit Imax, the voltage converter 3 is disabled again and subsequently re-enabled when the current I drops below the lower limit Imin. Repeated performance of this procedure results in a series of consecutively performed duty cycles, each comprising a first time interval T1, during which the voltage converter 3 is enabled and a second time interval T2, during which the voltage converter 3 is disabled. This is illustrated in FIGS. 2 and 3. FIG. 2 shows the current I(t) sensed by the current sensor 9 as a function of time starting at a starting time to, when the voltage converter 3 was initially enabled. FIG. 3 shows the corresponding operation states On, Off of the voltage converter 3, wherein the operation state On represents an operation state during which the voltage converter 3 is enabled and the wherein the operation state Off represents an operation state during which the voltage converter 3 is disabled.

Operation of the voltage converter 3 is controlled by a control system of the field device initially enabling the voltage converter 3 at the starting time to and subsequently operating the voltage converter 3 based on the current I sensed by the current sensor 9 as described above.

FIG. 1 shows an example of a control system comprising the current sensor 9 and a processor 19, like e.g. a microprocessor, a microcontroller, a field programmable gate array (FPGA) or an application specific integrated circuit (ASIC). The processor 19 is connected to the enabling port EN of the voltage converter 3 and embodied, e.g. programmed, to initially enable the voltage converter 3, e.g. by providing a corresponding voltage Uen to the enabling port EN of the voltage converter 3, as indicated by the arrow labeled Uen in FIG. 1.

As an option, the processor 19 is e.g. one of the battery powered components 7 or a part of one of the battery powered components 7 connected to the output OUT of the voltage converter 3. In this case, the field device is e.g. embodied to perform a startup routine, that is started by switching on the field device, during which the processor 19 is powered by the battery 1 via a power supply line 20 by-passing the voltage converter 3. Following the startup routine, the processor 19 is then powered by the power provided by the voltage converter 3.

Following the initial enabling, different approaches can be applied to subsequently operate the voltage converter 3 in the duty cycles described above.

As one option, an output of the current sensor 9 is directly connected to the enabling port EN of the voltage converter 3. In this case, the current sensor 9, in particular the comparator 13, is embodied as a switch providing an output signal $U_I$, like e.g. an output voltage, to the enabling port EN of the voltage converter 3 such, the voltage converter 3 is disabled when the current I exceeds the upper limit Imax and enabled again, when the current I drops below the lower limit Imin. This option is indicated by the dotted arrow labeled $U_I$ shown in FIG. 1.

As an alternative option, the processor 19 is connected to the output of the current sensor 9 and connected to the enabling port EN of the voltage converter 3 as shown in FIG. 1. In this case the processor 19 embodied to read the output $U_I$ provided by the current sensor 9 as indicated by the arrow labeled read in FIG. 1 and to provide a control signal indicated by the arrow labeled U(t) in FIG. 1, like e.g. a control voltage to the enabling port EN such that the voltage converter 3 is disabled when the current I exceeds the upper limit Imax and enabled again when the current I drops below the lower limit Imin.

During operation of the field device, the battery 1 is gradually being discharged due to the battery charge consumed by the field device, as well as due to ambient conditions the battery 1 is exposed to. Discharging of the battery 1 causes an inner series resistance of the battery 1 to increase. A dependency of the inner series resistance of the battery 1 on the state of charge SoC of the battery 1 can e.g. be determined based on a discharge curve characteristic for the type of battery applied. The discharge curve represents the battery voltage provided by the battery 1 as a function of the state of charge SoC of the battery. Discharge curves can be determined experimentally and are normally provided by the manufacturer of the battery 1. The increase of the inner resistance associated with the discharging depends on the state of charge SoC of the battery 1, and even batteries providing a battery voltage that is almost constant and/or decreasing very slowly at the beginning of their operating time will exhibit a significant increase of their inner series resistance towards the end of their operating time.

Regardless of the type of battery applied, an increase of the inner series resistance will result in a voltage drop of the battery voltage of corresponding size when the current I is drawn from the battery 1. In consequence, the time required for the current I to increase up the upper limit Imax during the first time intervals T1 will increase during the operating time of the battery 1 until the voltage drop caused by enabling the voltage converter 3 becomes so large, that the upper limit Imax is no longer reached. Thus, a duration ΔT1 of the first intervals T1 of the duty cycles corresponding to the time required for the current I to rise up to the upper limit Imax during the respective first time interval T1 increases as the inner series resistance of the battery 1 increases.

This effect is applied to monitor the state of charge SoC of the battery 1 by at least once determining the duration ΔT1 of one of the first intervals T1 and by at least once determining and providing the state of charge SoC of the battery 1 determined based on the duration ΔT1 of at least one of the first time intervals T1 and a previously determined dependency of the durations ΔT1 on the state of charge SoC of the battery 1.

To this extent, the field device comprises a timer 21 determining the duration ΔT1 of the first time intervals T1 and a battery status determination unit 23 determining the state of charge SoC of the battery 1 based on at least one of the durations ΔT1 determined by the timer 21 and the dependency stored in a memory 25 associated to the battery status determination unit 23. The timer 21 is e.g. connected to the output of the current sensor 9 and/or connected to the enabling port EN of the voltage converter 3. As an option the timer 21 is e.g. embodied as a separate unit or as an integral part of the processor 19 connected to the output of the current sensor 9 and/or connected to the enabling port EN of the voltage converter 3.

As an option, shown in FIG. 1, the timer 21 and the battery status determination unit 23 are e.g. both embodied as an integral part of the processor 19 embodied to read the output $U_I$ provided by the current sensor 9. In this case, the processor 19 reads the output $U_I$ provided by the current sensor 9, determines the duration ΔT1 of at least one of the first time intervals T1, and at least once determines the state of charge SoC of the battery 1 based on at least one of the durations ΔT1 and the previously determined dependency stored in the memory 25 associated to the processor 19.

As an example, the dependency is e.g. determined experimentally by measuring the durations ΔT1 attained by operating the field device and/or at least one field device of the same type with batteries 1 of the same type having different known states of charge. As an alternative, the dependency is e.g. determined numerically based on the discharge curve characteristic of the battery 1 and the properties of the field device.

As an option, the dependency is e.g. determined and/or stored in the memory 25 in form of a look up table and/or in form of a function representing the state of charge SoC as a function of the duration ΔT1 of the first intervals T1 or vice versa.

As an option, providing the state of charge SoC of the battery 1 comprises at least one of the steps of:
at least once providing and/or indicating a battery charging level corresponding to the determined state of charge SoC of the battery 1,
providing and/or indicating a warning when the state of charge SoC drops below a predetermined first charging level; and
providing and/or indicating an alarm, when the state of charge SoC drops below a predetermined second charging level.

As an example the battery charging level is e.g. indicated on a display 27 connected to the battery status determination unit 23 or provided in form of a signal $S_{SoC}$ provided via an interface 29 connected to the battery status determination unit 23. The warning and/or the alarm are e.g. each indicated by an LED 31, 33 connected to the battery status determination unit 23, indicated on the display 27 and/or provided in form of a warning signal or an alarm signal provided via the interface 29 of the field device.

The method as well as the field device embodied to perform this method comprise the advantages mentioned above. Individual steps of the method, as well as individual parts of the field device can be implemented in different ways without deviating from the scope of the invention. Several optional embodiments are described in more detail below.

As an option, the field device e.g. comprises a smoothing capacitor C1 connected in parallel to the battery 1 between the battery 1 and the voltage converter 3. This smoothing capacitor C1 is charged by the battery 1 during the second time intervals T2, during which the voltage converter 3 is disabled and discharged during the first time intervals T1, during which the voltage converter 3 is enabled. This provides the advantage, that sudden current spikes and drops caused by the intermittent operation of the voltage converter 3 are smoothed by charging and discharging the smoothing capacitor C1. In the example shown in FIG. 1, the smoothing capacitor C1 is connected to the line 11 at a connecting point P2 located between the sensing resistor Rs and the input port IN of the voltage converter 3.

As another additional or alternative option, the field device e.g. comprises an energy storage Cs, like e.g. an energy storage Cs consisting essentially of a supercapacitor or comprising at least one supercapacitor. This energy storage Cs is connected to the output OUT of the voltage converter 3 in parallel to the component 7. In the example shown in FIG. 1, the energy storage Cs is connected in parallel to the component 7 in a position located between the voltage converter 3 and the component 7. As shown, this is e.g. achieved by connecting the energy storage Cs to a line 35 connecting the output OUT of the voltage converter 3 to the component 7 at a connecting point P3 located between the output OUT and the component 7.

The energy storage Cs is charged with power provided by the battery 1 and supplied to the energy storage Cs by the voltage converter 3 during at least one first time period and provides at least a fraction of the power required to operate the component 7 to the component 7 of the field device during at least one second time period.

The first time periods comprise time periods during which the power supplied by the battery 1 via the voltage converter 3 is sufficiently high to provide the power required by the component 7 and to charge the energy storage Cs. To this extent, the first time periods e.g. comprise at least one time period at the beginning of the operating time of the battery 1 during which the state of charge SoC of the battery 1 is high.

The second time periods e.g. comprise at least one time period, during which the power supplied by the voltage converter 3 is zero or insufficient to power the component 7. As an example, the second time periods e.g. comprise at least one low charge time period, during which the state of charge SoC of the battery 1 is lower than a predetermined charging level.

The energy stored in the energy storage Cs during the first time periods provides the advantage that it makes it possible to extent the operating time of the component 7 beyond the point in time, when the state of charge SoC of the battery 1 has decreased so much, that the battery 1 is no longer capable of providing enough power to operate the component 7. Depending on the power consumption of the component 7 and the energy storage capacity of the energy storage Cs, an extension of the operating time of the component 7 of several days or even weeks can be achieved. Thus, once the state of charge SoC of the battery 1 has reached a low charging level determined and/or indicated by the field device, the extension of the operating time of the component 7 available due to the energy previously stored in the energy storage Cs gives the operator of the field device ample time to recharge or replace the battery 1. During the extension of the operating time proper operation of the component 7 is ensured by the energy stored in the energy storage Cs.

As an option, the energy stored in the energy storage Cs can be and/or is applied to power the component 7 when the battery 1 is being recharged, replaced or removed. Thus, in case the battery 1 is a disposable battery, the second time periods e.g. comprise at least one replacement period, during which the battery 1 is replaced. In case the battery 1 is a rechargeable battery, the second time intervals e.g. comprise at least one recharging period, during which the battery 1 is being recharged, and/or at least one replacement period, during which the rechargeable battery 1 is being replaced. In this respect, the energy storage Cs provides the additional advantage, that the battery 1 can be temporarily removed during one of the second time periods and subsequently reinstalled, without requiring a restart of the battery powered components 7 of the field device.

When the energy storage Cs consist of a supercapacitor or comprises at least one supercapacitor, the intermitted operation of the voltage converter 3 operated in duty cycles during the first time periods provides the advantage, that it limits the charging power supplied to the energy storage Cs and thus enhances the life time of the supercapacitor(s).

As an additional or alternative option the field device e.g. comprises a buffering capacitor C2 connected in parallel to the battery 1 between the battery 1 and the voltage converter 3. In the example shown in FIG. 1, one terminal of the buffering capacitor C2 is connected to the line 11 connecting the terminal 5 of the battery 1 to the voltage converter 3 at a connecting point P4 located between the terminal 5 of the battery 1 and the sensing resistor Rs.

As an option, this buffering capacitor C2 is e.g. applied to extend the operating time of the battery 1. To this extent, the state of charge SoC of the battery 1 is monitored and the operation mode of the voltage converter 3 is changed into an empty mode, when the state of charge SoC drops below a predetermined low charging level. Monitoring the state of charge SoC of the battery 1 and determining the point in time when the state of charge SoC drops below the low charging level is e.g. performed by the battery status determination unit 23 embodied, e.g. programmed, to perform these method steps based on the states of charge SoC determined by the status determination unit 23 or based on the durations $\Delta T1$ determined by the timer 21. When the status determination unit 23 determines, that the state of charge SoC has dropped below the predetermined low charging level or that the durations $\Delta T1$ exceed a predetermined duration limit, it provides a corresponding output to the control system. Upon receipt of this output, the control system then operates the step of converter 3 in the empty mode. During the empty mode, the voltage converter 3 is operated in empty mode duty cycles. Each empty mode cycle comprises a recovery time interval during which the voltage converter 3 is disabled and an operating time interval during which the voltage converter 3 is enabled. As an option, the operating time intervals are shorter than the recovery time intervals.

During the recovery intervals no current is drawn by the voltage converter 3. This enables the battery 1 to recover. In consequence, the battery voltage of the recovering battery 1 will increase and the buffer capacitor C2 will be charged by the recovering battery 1 up to a charging level corresponding to the battery voltage of the recovering battery 1.

During the operating time intervals the current drawn by the voltage converter 3 is provided by both the battery 1 and the buffering capacitor C2. Thus, even though enabling the voltage converter 3 will cause a voltage drop of the battery voltage, this voltage drop will be smaller due to the additional charge provide by the buffer capacitor C2, that has been charged during the preceding recovery interval. In consequence, the empty mode provides the advantage, that it can be used to extend the operating time of the battery 1.

The invention claimed is:

1. A method of monitoring a state of charge of a battery of a field device, the field device including the battery and a voltage converter having an input connected to the battery and an output connected to at least one component of the field device powered by the battery, the method comprising:
   initially enabling the voltage converter and subsequently operating the voltage converter in duty cycles performed based on a current flowing from the battery to the voltage converter by repeatedly performing the steps of:
      disabling the voltage converter when the current drawn by the enabled voltage converter exceeds a predetermined upper limit, and
      enabling the voltage converter again when the current drops below a predetermined lower limit,
      wherein each duty cycle includes a first time interval during which the voltage converter is enabled and a second time interval during which the voltage converter is disabled;
   determining a duration of one of the first time intervals; and
   determining and providing a state of charge of the battery determined based on the duration and a previously determined dependency of the duration on the state of charge of the battery.

2. The method of claim 1, wherein providing the state of charge of the battery includes the steps:
   providing or indicating a battery charging level corresponding to the determined state of charge of the battery;

providing or indicating a warning when the state of charge drops below a predetermined first charging level; and providing or indicating an alarm, when the state of charge drops below a predetermined second charging level.

3. The method of claim 1,
wherein the field device further includes an energy storage connected to the output of the voltage converter in parallel to the component, wherein the energy storage includes a supercapacitor,
wherein during at least one first time period the energy storage is charged with power provided by the battery and supplied to the energy storage by the voltage converter; and
wherein during at least one second time period at least a fraction of the power required to operate the component is provided to the component by the energy storage.

4. The method of claim 3, wherein the supercapacitor is a hybrid layer capacitor including lithium intercalation compounds.

5. The method of claim 3, wherein:
the at least one first time period includes at least one time period during which the power supplied by the battery via the voltage converter is sufficiently high to provide the power required by the at least one component and to charge the energy storage and/or at least one time period at the beginning of the operating time of the battery; and
the at least one second time period includes at least one of:
  at least one time period during which the power provided by the voltage converter is zero or insufficient to power the component,
  at least one low charge time period during which the state of charge of the battery is lower than a predetermined charging level,
  at least one replacement period during which the battery is replaced,
  at least one recharging period during which the battery is being recharged, and
  at least one time period during which the battery is removed from the field device.

6. The method of claim 1, wherein the field device further includes:
a buffering capacitor connected in parallel to the battery between the battery and the voltage converter to extend an operating time of the battery, wherein the method further comprises:
monitoring the state of charge of the battery; and
changing an operation mode of the voltage converter into an empty mode when the state of charge drops below a predetermined low charging level by subsequently operating the voltage converter in empty mode duty cycles, each empty mode duty cycle comprising:
  a recovery time interval during which the voltage converter is disabled to enable the battery to recover and to charge the buffering capacitor up to a charging level corresponding to a battery voltage of the recovering battery, and
  an operating time interval during which the voltage converter is enabled and during which the current drawn by the voltage converter is provided by both the battery and the buffering capacitor.

7. The method of claim 6, wherein the operating time intervals are shorter than the recovery time intervals.

8. A field device, comprising:
a battery;
a voltage converter having an input connected to the battery and an output connected to at least one component of the field device powered by the battery;
a control system including:
  a processor; and
  a current sensor configured to sense a current flowing from the battery to the voltage converter,
  wherein the control system is embodied to initially enable the voltage converter and to subsequently operate the voltage converter in duty cycles based on the current sensed by the current sensor by disabling the voltage converter when the current drawn by the voltage converter exceeds an upper limit and by enabling the voltage converter when the current drops below a lower limit;
a timer configured to determine a duration of the first time intervals of the duty cycles during which the voltage converter is enabled; and
a battery status determination unit configured to determine and to provide a state of charge of the battery based on at least one of the durations determined by the timer and the dependency of the durations on the state of charge of the battery stored in a memory associated to the battery status determination unit.

9. The field device of claim 8, further comprising:
an energy storage including a supercapacitor, wherein the energy storage is connected to the output of the voltage converter in parallel to the at least one component.

10. The field device of claim 8, further comprising:
a smoothing capacitor connected in parallel to the battery between the battery and the voltage converter and smoothing current spikes and drops caused by operating the voltage converter in the duty cycles.

11. The field device of claim 8, further comprising:
a buffering capacitor connected in parallel with the battery between the battery and the voltage converter,
wherein the battery status determination unit is embodied to monitor the state of charge of the battery based on the state of charge determined by the battery status determination unit or based on the durations of the first time intervals determined by the timer and to provide an output to the control system when the state of charge drops below a predetermined low charging level or when the durations exceed a predetermined duration limit, and
wherein the control system is embodied to upon receipt of the output provided by the battery status determination unit then operate the step of converter in empty mode duty cycles, each empty mode duty cycle comprising:
  a recovery time interval during which the voltage converter is disabled to enable the battery to recover and to charge the buffering capacitor up to a charging level corresponding to a battery voltage provided by the recovering battery, and
  an operating time interval during which the voltage converter is enabled and during which the current drawn by the voltage converter is provided by both the battery and the buffering capacitor.

12. The field device of claim 8, wherein the current sensor includes:
a sensing resistor inserted in a line connecting a terminal of the battery to the input of the voltage converter; and
a comparator having a first input connected to the line at a connecting point located between the terminal of the battery and the sensing resistor and a second input connected to the line at a connecting point located between the sensing resistor and the input port of the voltage converter and providing an output corresponding to the current sensed by the current sensor.

13. The field device of claim 8,
wherein an output of the current sensor is connected to an enabling port of the voltage converter, and
wherein the current sensor is embodied as a switch providing an output signal or an output voltage to the enabling port of the voltage converter such that the voltage converter is disabled when the current sensed by the current sensor exceeds the upper limit and the voltage converter is enabled when the current sensed by the current sensor drops below the lower limit.

14. The field device of claim 8,
wherein the processor is connected to an output of the current sensor and connected to an enabling port of the voltage converter, and
wherein the processor is configured to read an output provided by the current sensor and to provide a control signal or a control voltage to the enabling port such that the voltage converter is disabled when the current sensed by the current sensor exceeds the upper limit and enabled when the current sensed by the current sensor drops below the lower limit.

15. The field device of claim 8,
wherein the battery is a disposable battery or a rechargeable battery comprising a single battery element or a battery pack comprising two or more battery elements, and
wherein the battery status determination unit is connected to a display indicating a battery charging level determined by the battery status determination unit, indicating a warning when the state of charge drops below a predetermined first charging level and/or indicating an alarm when the state of charge drops below a predetermined second charging level; an interface providing a signal corresponding a battery charging level determined by the battery status determination unit, providing a warning signal when the state of charge drops below a predetermined first charging level and/or providing an alarm signal when the state of charge drops below a predetermined second charging level; and/or at least one LED indicating a warning when the state of charge drops below a predetermined first charging level and/or indicating an alarm when the state of charge drops below a predetermined second charging level.

16. The field device of claim 8, wherein the field device is a field device measuring at least one variable, a measurement device or a sensor, an actuator, a portable device, a battery operated service tool embodied to be connected to or to communicate with another field device and/or embodied to service, to configure and/or parametrize the other field device, a battery powered user interface embodied to be connected to or to communicate with another field device, a battery powered adapter, or a communication interface or a wireless communication interface enabling another field device connected to the communication interface or to the wireless communication interface to communicate with another field device and/or with a superordinate unit, a control system or a programmable logic control unit.

* * * * *